United States Patent [19]
Blonder et al.

[11] Patent Number: 5,179,609
[45] Date of Patent: Jan. 12, 1993

[54] OPTICAL ASSEMBLY INCLUDING FIBER ATTACHMENT

[75] Inventors: Greg E. Blonder, Summit, N.J.; Mindaugas F. Dautartas, Alburtis; Yiu-Huen Wong, Summit, N.J.

[73] Assignee: AT&T Bell Laboratories, Murray Hill, N.J.

[21] Appl. No.: 756,263

[22] Filed: Aug. 30, 1991

[51] Int. Cl.⁵ .......................... G02B 6/00; G02B 6/36
[52] U.S. Cl. ...................................................... 385/89
[58] Field of Search .................................... 385/88–94

[56] References Cited

U.S. PATENT DOCUMENTS

| | | | |
|---|---|---|---|
| H551 | 12/1988 | Chaoui et al. | 385/90 |
| 4,030,811 | 6/1977 | Khoe et al. | 385/91 |
| 4,702,547 | 10/1987 | Enochs | 350/96.20 |
| 4,725,114 | 2/1988 | Murphy | 350/96.17 |
| 4,729,623 | 3/1988 | Mery | 385/91 |
| 4,744,626 | 5/1988 | Mery | 385/90 |
| 4,750,799 | 6/1988 | Kawachi et al. | 350/96.11 |
| 4,779,946 | 10/1988 | Pimpinella et al. | 385/91 X |
| 4,890,895 | 1/1990 | Zavracky et al. | 350/96.20 |
| 4,904,036 | 2/1990 | Blonder | 350/96.11 |
| 4,945,400 | 7/1990 | Blonder et al. | 357/74 |

FOREIGN PATENT DOCUMENTS

| | | | |
|---|---|---|---|
| 3433717 | 3/1986 | Fed. Rep. of Germany | 385/92 |
| 61-173206 | 8/1986 | Japan | 385/91 |
| 1-169417 | 7/1989 | Japan | 385/90 |

OTHER PUBLICATIONS

"A New Packaging Technology...", H. Tsunetsugu et al., p. 479 et seq., 1991.

Primary Examiner—Akm E. Ullah
Attorney, Agent, or Firm—W. W. Koba

[57] ABSTRACT

An optical assembly is disclosed which utilizes a pair of separate members to support an optical device and an associated optical fiber. Fiducial features, in conjunction with an optical device conductive attachment means, are utilized to provide self-alignment between the device and the fiber. Aligned fiducials are formed on each member such that when the members are physically joined, alignment between the optical device and fiber is achieved. In particular, the members are mated such that a direct optical signal path between the device and fiber is formed.

24 Claims, 7 Drawing Sheets

OPTICAL ASSEMBLY INCLUDING FIBER ATTACHMENT

BACKGROUND OF THE INVENTION

1. Technical Field

The present invention relates to an optical assembly including an aligned fiber attachment and, more particularly, to an assembly capable of providing self-alignment between an active optical device and the associated optical fiber.

2. Description of the Prior Art

In the realm of optical device packaging, there is beginning to develop a number of assemblies which utilize a single crystal semiconductor material (such as silicon) as the support structure for the various optical devices. Often referred to as "silicon optical bench" technology, the utilization of silicon may result in a significant cost saving in optical packaging over some of the more esoteric materials which have been used in the past. More importantly, silicon processing technology has advanced to the stage where a number of relatively simple procedures (e.g., oxidation, etching—isotropic or anisotropic) may be utilized to facilitate attachment of the devices to the support member, as well as alignment therebetween. Further, it is possible to form optical waveguiding structures directly in/on a silicon substrate, resulting in the ability to form a completely operable optical subassembly in silicon.

An exemplary utilization of silicon in the formation of a subassembly for optoelectronic devices is disclosed in U.S. Pat. No. 4,945,400, (Blonder et al.) issued Jul. 31, 1990 and assigned to the assignee of record in this application. In general, Blonder et al. disclose a subassembly including a semiconductor (e.g., silicon) base and lid including a variety of etched features (e.g., grooves, cavities, alignment detents) and metallization patterns (e.g., contacts, reflectors) which enable the optoelectronic device to be reliably and inexpensively mounted on the base and coupled to a communicating optical fiber. In particular, Blonder et al. disclose an arrangement wherein the optoelectronic device (e.g., LED) is disposed within a cavity formed by a lid member and the communicating fiber is positioned along a groove formed in a base member. A reflective metallization is utilized to optically couple the device to the fiber. Therefore, positioning of the device over the reflector is the only active alignment step required to provide coupling. Any remaining alignments are accomplished utilizing fiducial features formed in the base and lid members.

Although the Blonder et al. subassembly represents a significant advance in the field of silicon optical bench packaging, a need remains for providing an arrangement which requires no active alignments to be performed. The provision of a completely passive optical packaging arrangement being considered both more reliable and less expensive than virtually any alternative requiring active alignment between components.

SUMMARY OF THE INVENTION

The need remaining in the prior art is addressed by the present invention which relates to an optical assembly including an aligned fiber and, more particularly, to an assembly capable of providing self-alignment between an active optical device and an associated optical fiber.

In accordance with an exemplary embodiment of the present invention, an optical assembly may comprise a first member (i.e., header) for supporting an active optical device and and a second member (i.e., base) including a groove for holding an associated optical fiber. The first and second members further comprise fiducial features (e.g., detents and spheres) which function to align and mechanically attach the first member to the second member. The attachment is accomplished such that the first and second members are positioned to form a direct signal path between the fiber and the optical device. The optical device is disposed on and attached to an electrically conductive bonding means (e.g., solder preform, electroplated solder material, or deposited solder material), the attachment means being positioned with respect to the fiducial features such that self-alignment between the optical device and fiber is achieved.

In one embodiment of the present invention, the first and second members may comprise silicon substrates which are etched to form the alignment fiducials. For example, pyramidal openings (detents) may be etched into the silicon surface and spheres inserted between (and physically attached to) the detents to align and mechanically attach the members. In an alternative embodiment, the members may comprise a plastic material, where each member is separately formed (using injection molding, for example) to include the required alignment fiducials.

A third member may be utilized in accordance with the teachings of the present invention as a lid to cover the surface of the second member containing the optical fiber. Another set of fiducial features may be utilized to attach the third member to the second member.

An advantage of the present invention is that the utilization of the alignment fiducials with the self-alignment electrically conductive attachment means provides for an optical assembly with completely passive alignment between the active optical device and the associated optical fiber.

Another advantage of the present invention is that an array structure may easily be formed, with a plurality of optical devices attached along the surface of a first member and an associated plurality of grooves and fibers formed along a second member. The utilization of an appropriate material (such as silicon or plastic) facilitates the formation of the array structure.

BRIEF DESCRIPTION OF THE DRAWING

Referring now to the drawings, where like numerals represent like parts in several views, FIG. 1. illustrates an exemplary optical assembly formed in accordance with the teachings of the present invention.

DETAILED DESCRIPTION

Figure 1:
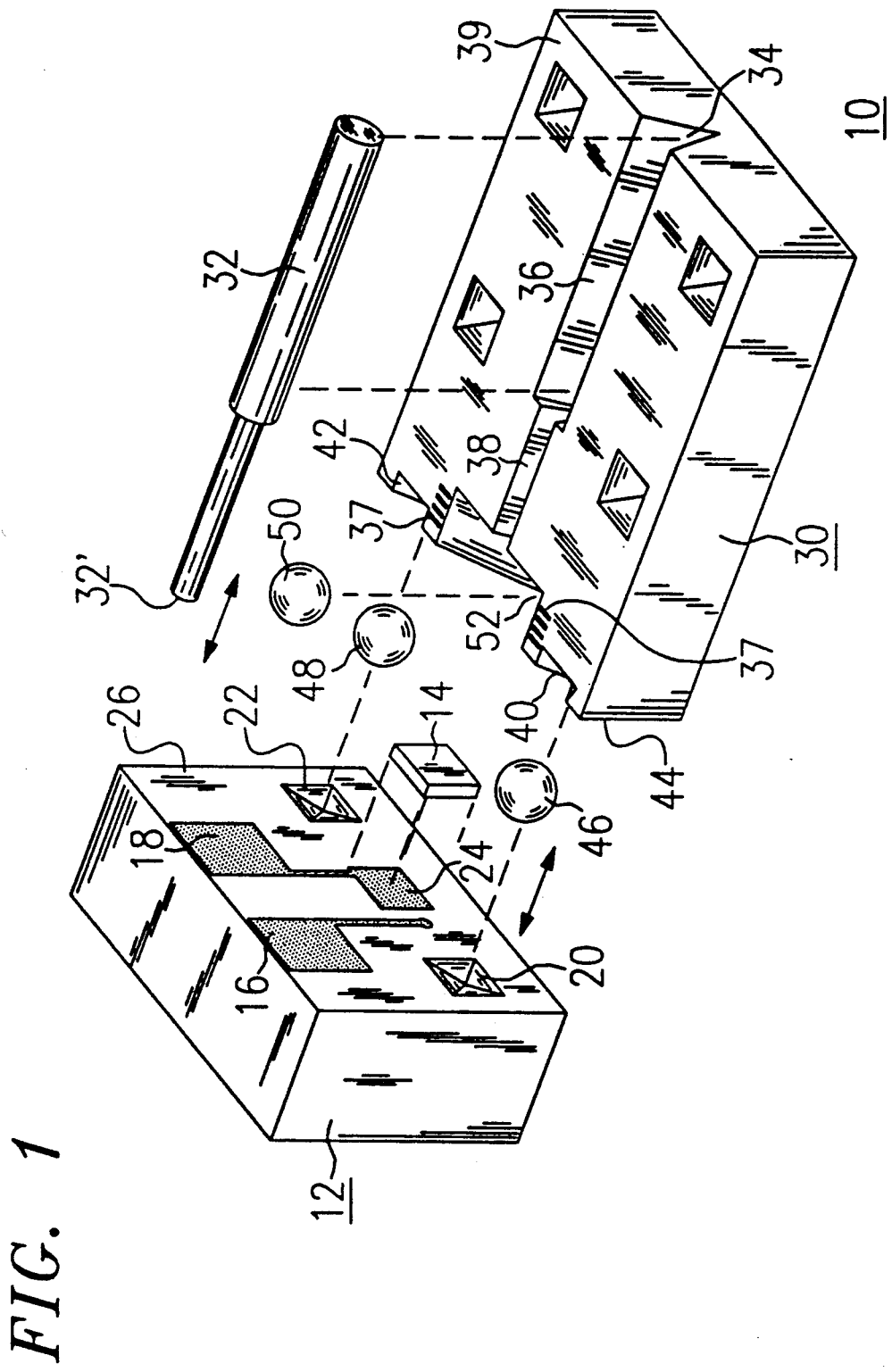

An exemplary optical assembly 10 formed in accordance with the present invention is illustrated (in an exploded view) in FIG. 1. Optical assembly 10 comprises a first member 12, also referred to as a header, for supporting an optical device (e.g., LED) 14 and associated electrical contact pads 16, 18. As will be discussed in detail below, first member 12 (as well as other members described hereinafter) may comprise any suitable material capable of being processed to include the requisite alignment fiducials. For example, semiconductor substrate materials such as silicon or GaAs may be used and etched to form the alignment fiducials. Alternatively, a plastic material, such as a high-performance engineering plastic, may be used and molded to form the alignment fiducials.

Referring back to FIG. 1, header 12 further comprises a pair of fiducial features 20 and 22 located, in this particular example, on either side of electrically conductive bonding means 24. Conductive means 24 may comprise a solder preform, an electroplated layer of conductive material, a deposited layer of conductive material, or any other suitable arrangement capable of providing physical and electrical attachment of device 14 to header 12. The remaining electrical contact to device 14 may be provided by a wirebond (not shown) between electrical contact pad 16 and the top side of device 14. Alternatively, if both contacts are located on the same side of device 14, a pair of (electrically isolated) conductive means may be utilized. In accordance with the teachings of the present invention, fiducials 20, 22 are utilized to provide alignment between optical device 14 and an associated optical fiber. In particular, member 12 is processed to locate fiducials 20, 22, as well as conductive means 24, with sufficient certainty such that self-alignment between the device and fiber is achieved. Fiducials 20, 22 may comprise a pair of pyramidal openings formed in top surface 26 of header 12. If header 12 comprises a semiconductor material such as silicon, fiducials 20, 22 may be formed by etching top surface 26 of member 12.

Optical assembly 10 further comprises a second member 30, also referred to as a base, for supporting an optical fiber 32 within a groove 34. As illustrated in FIG. 1, groove 34 may include a first enlarged portion 36 for supporting a plastic-coated optical fiber, and a second, narrowed portion 38 for supporting a stripped, bare glass fiber section. Base 30 further comprises a pair of fiducials 40, 42 formed on surface 39 of base 30 and intercepting an orthogonal sidewall 44. As indicated by the arrows in FIG. 1, header 12 and base 30 are moved toward each other such that fiducials 20, 22 align with fiducials 40, 42, resulting in the optical alignment between device 14 and fiber 32. A coupling lens 50 may also be disposed in an opening 52 formed in sidewall 44 of base 30. Lens 50 is utilized to improve the coupling efficiency between optical device 14 and optical fiber 32. Alternatively, a lensed optical device and/or lensed optical fiber may be used to increase the coupling efficiency. Mechanical attachment of header 12 and base 30 is accomplished by utilizing a pair of spherical members 46, 48 positioned within the pair of cavities created by the aligned fiducials. As shown, spherical members are in physical contact with both header 12 and base 30, resulting in a gap between surfaces 26 and 44. The gap allows for process variations in the formation of base 30 without affecting the alignment of the optical device to the fiber. It is to be noted that in the formation of the fiducials, any number of separate alignment features may be utilized, the pair of fiducials illustrated in FIG. 1 being considered as exemplary only. Further, there may exist other types of fiducial features which could be utilized in place of the pyramidal openings and spheres illustrated in FIG. 1. For example, alignment grooves and ridges may be included in the separate members and utilized to provide both alignment and mating therebetween.

Figure 2:
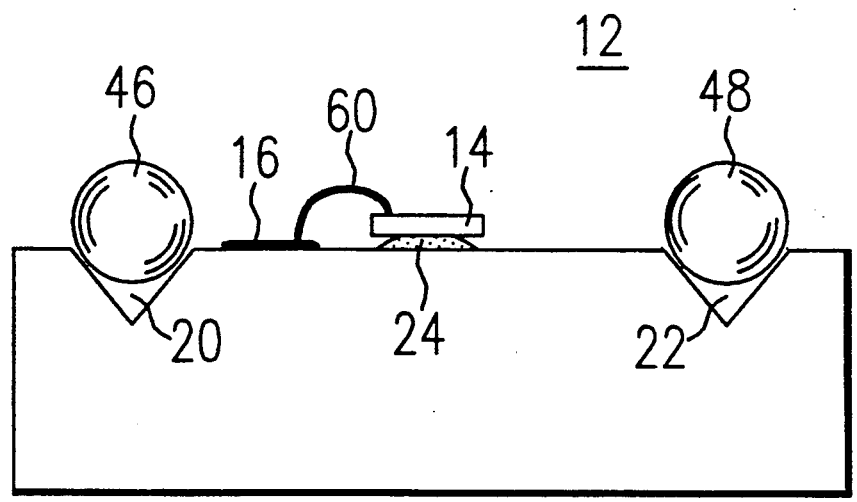
FIG. 2. illustrates cut-away side view of an exemplary first member, utilized as a support for an optical device.

FIG. 2 illustrates a cut-away side view of an exemplary first member (header) 12. Important to the self-aligning feature of the present invention is the ability to locate device 14 with respect to fiducials 20, 22 such that when header 12 and base 30 are mated, fiber 32 will be optically aligned with device 14. The utilization of conductive means 24 has been found to provide the desired alignment. As shown, device 14 is attached to conductive means 24, where means 24 is disposed between fiducials 20 and 22. In the assembly of the illustrated arrangement, device 14 is placed on solder means 24 (which may comprise a tin-gold compound or any other suitable/compatable well-known conductive material), and the combination heated to a temperature sufficient to liquify conductive means 24 (without affecting device 14) and thus cover (i.e. "wet") an underlying electrical pad (not shown). The surface tension created by liquified means 24 results in forming a dome-like mass of material, defined by the boundary of the underlying electrical pad. Device 14 will thus "float" on the surface thereof so as to align with the material. Therefore, as long as the underlying electrical pad is properly positioned with respect to fiducials 20, 22, device 14 will be properly disposed so as to be in optical alignment with an attached fiber 32 (FIG. 1).

Figure 3:
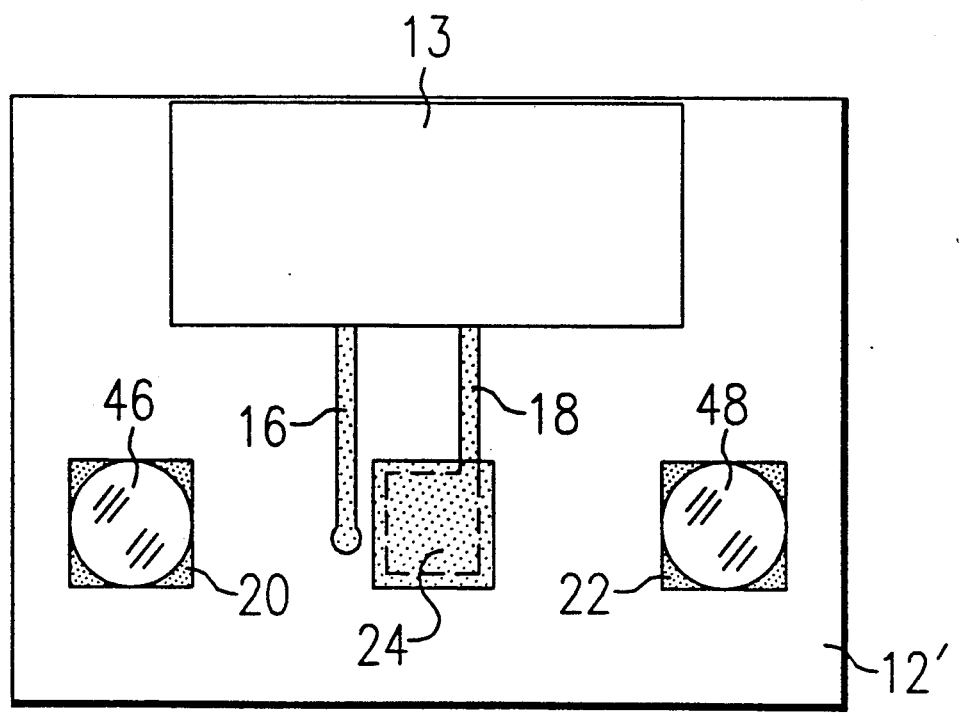
FIG. 3 illustrates a top view of an alternative first member, showing the co-location of an electronic circuit associated with the active optical device.

FIG. 3 illustrates a top view of an alternative header 12' which is formed to include the electronic circuitry 13 associated with the operation of optical device 14. For example, when silicon or another semiconductor substrate material is used to form header 12', the circuit may be directly fabricated in/on the surface of the header. Alternatively, when a plastic material is used, the circuitry may be physically attached to the top surface thereof. The ability to co-locate the circuitry with the optical device thus reduces the overall size of the resulting arrangement. Further, in the case of an optical receiving arrangement, the ability to form a circuit, such as a pre-amplifier, in close proximity to the optical receiving device (e.g., photodiode) reduces the electrical path lengths required to connect the devices, and thus reduces any parasitics associated with the arrangement. It is to be understood that a transmitting arrangement may also be so formed, with a optical transmitting device such as an LED or laser co-located with a driver circuit.

Figure 4:
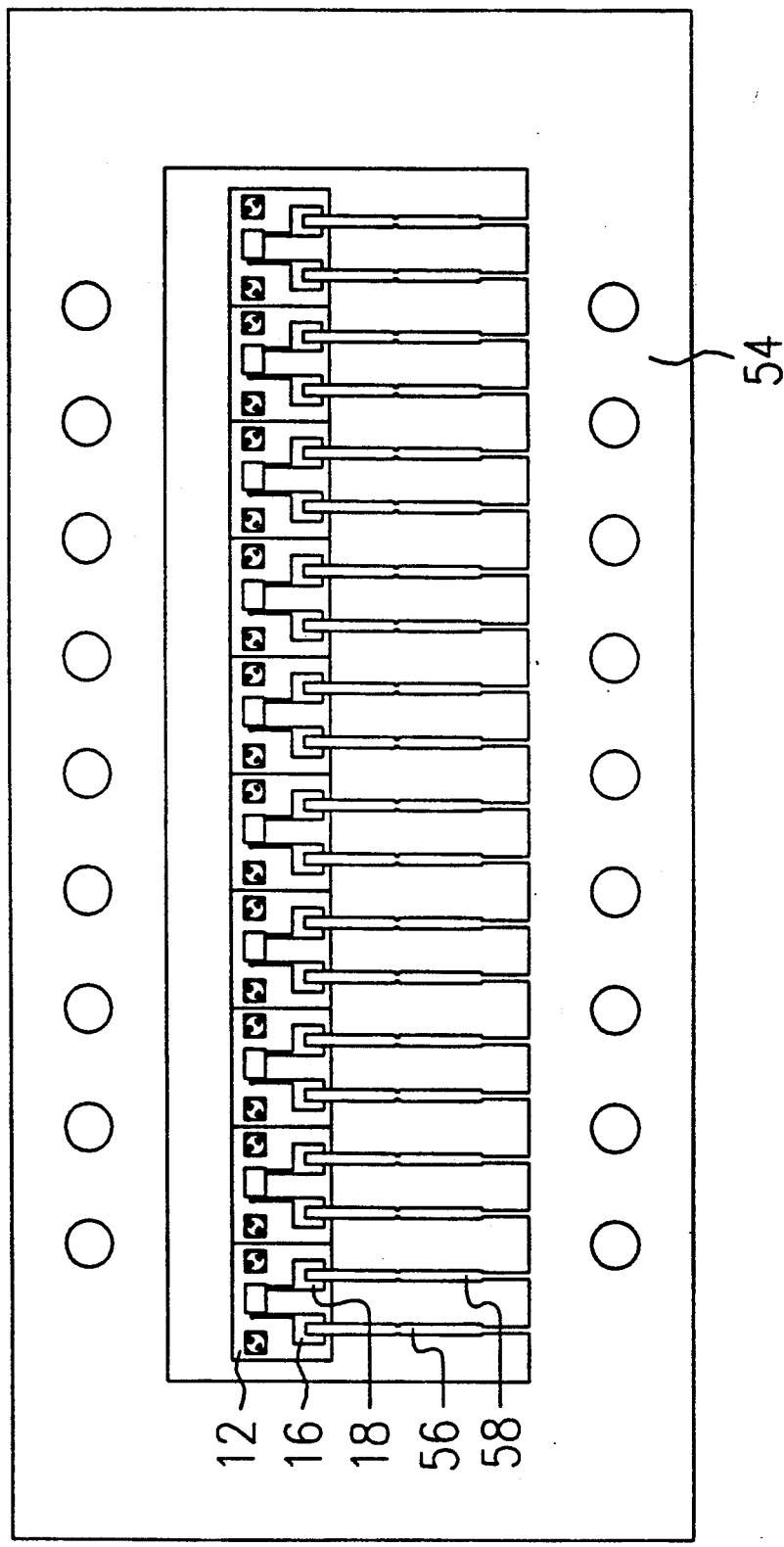
FIG. 4 illustrates an exemplary leadframe structure which may be utilized in the batch processing of a plurality of first members as illustrated in FIG. 2.
Figure 5:
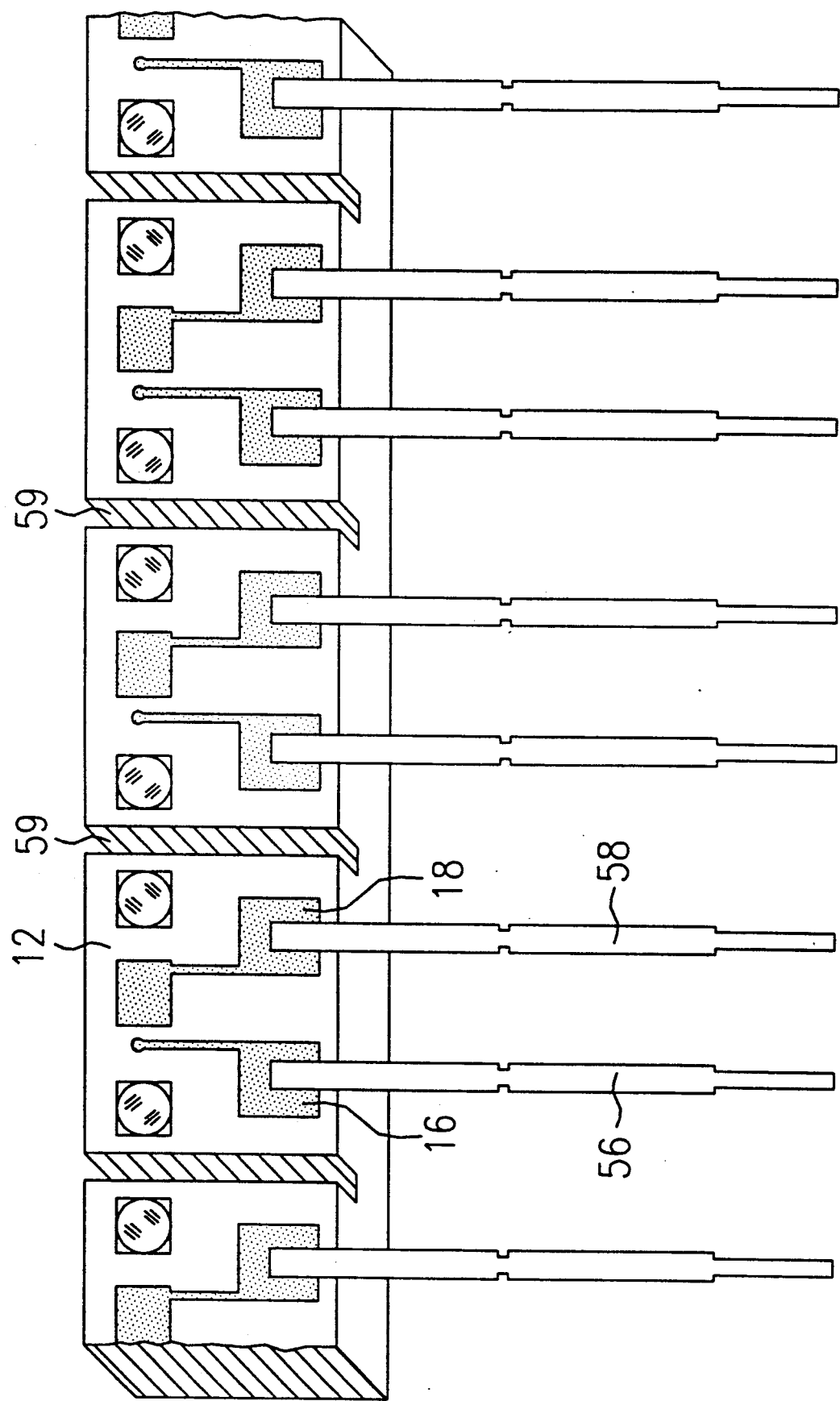
FIG. 5 illustrates an exemplary section of a wafer, supporting a plurality of first members and associated leadframe structure, as illustrated in FIG. 4.

An advantage of the arrangement of the present invention is the ability to batch fabricate, as well as test, the header assemblies. FIG. 4 illustrates an exemplary arrangement illustrating a leadframe 54 attached to a plurality of headers 12, each each being of the type illustrated in detail in FIG. 2. As shown, leadframe 54 comprises a plurality of lead pairs 56, 58, each lead pair being bonded to a separate pair of electrical pads 16, 18 located on header 12. A wirebond 60 (illustrated in FIGS. 2, 3) may be utilized to provide the final electrical connection between lead 56, electrical pad 16, and the top side of device 14. In general, the plurality of headers 12 may be subjected to a number of electrical tests to assess the operability of the individual units prior to being mated with the an associated base member 30. The ability to batch test the header assemblies may thus result in a cost saving in the final optical subassembly. A wafer 57 containing the plurality of headers 12 may be pre-cut along the edges 59 of headers 12, as shown in FIG. 5, through a predetermined portion of the wafer thickness. Upon completion of the batch testing, the individual headers may then simply be snapped apart.

Figure 6:
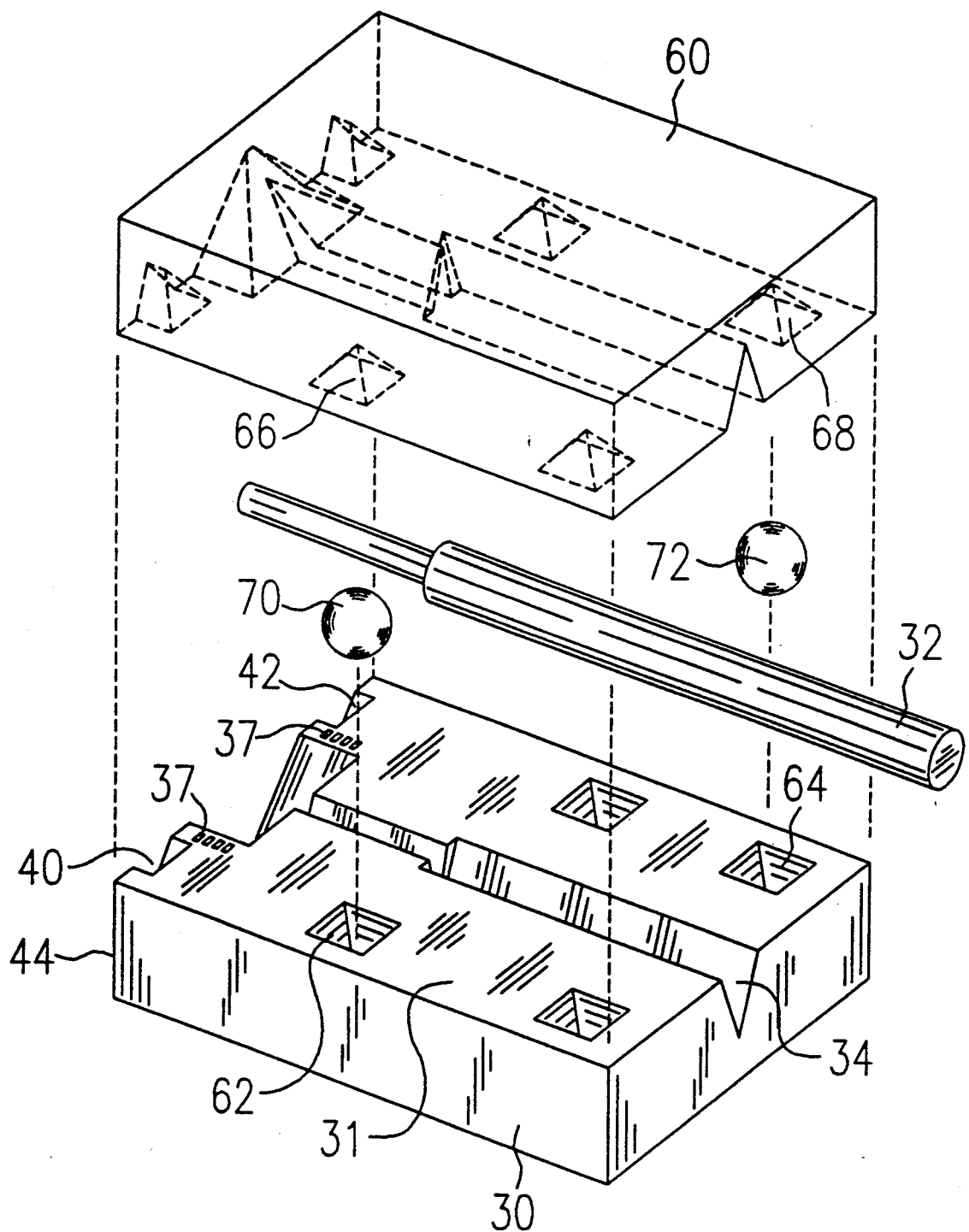
FIG. 6 illustrates an exemplary arrangement of a second member, utilized as a support for an optical fiber.

A fiber subassembly, including an optional third member 60 (lid) is illustrated in FIG. 6. In some packaging applications, it may be advantageous to include a lid 60 which substantially covers fiber 32 as supported by groove 34 in base member 30. Alignment and attachment of lid 60 to base 30 may be accomplished, in accordance with the present invention, by utilizing an additional set of fiducial features. In particular, base 30 of FIG. 6 is illustrated as including a pair of fiducials 62, 64, formed as a pair of pyramidal openings in top surface 31 of base 30. In general, any suitable number (as well as location) of fiducials may be utilized. An associated pair of fiducials 66, 68 are formed in lid 60 so as to be in alignment with fiducials 62, 64. A pair of spheres 70, 72 are positioned between base 30 and lid 60 so as to be located within the cavities formed by the aligned fiducials and provide mechanical attachment therebetween.

Figure 7:
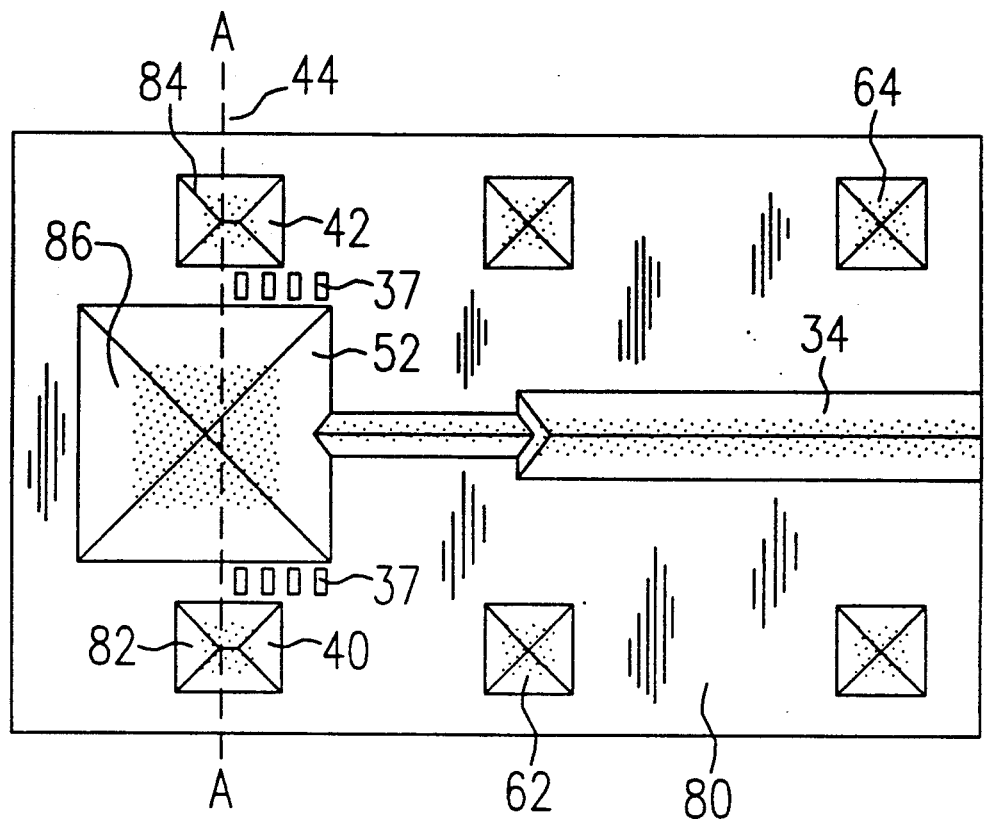
FIG. 7 illustrates an exemplary substrate arrangement which may be processed to form a second member as illustrated in FIG. 5.

An important aspect of the present invention is the ability to form fiducials 40, 42 in an intercepting sidewall 44 of second member 30 with sufficient accuracy such that alignment with first member 12 is achieved. FIG. 7 illustrates a top view of an exemplary starting substrate 80 (which may comprise silicon, plastic, or any other suitable material) which may be processed to form second member 30. As shown in the illustration of second member 30, starting substrate 80 is processed to form groove 34 for supporting fiber 32, as well as alignment fiducials 62, 64 (optional) for attaching lid 60 to second member 30. Substrate 80 is further processed, as shown in FIG. 7, to form a pair of pyramidal openings 82 and 84 on either side of a relatively large pyramidal opening 86. Second member 30 is formed from substrate 80 by dicing substrate 80 along line A—A, as shown in FIG. 7. As shown, therefore, line A—A forms sidewall 44 of second member 30.

Figure 8:
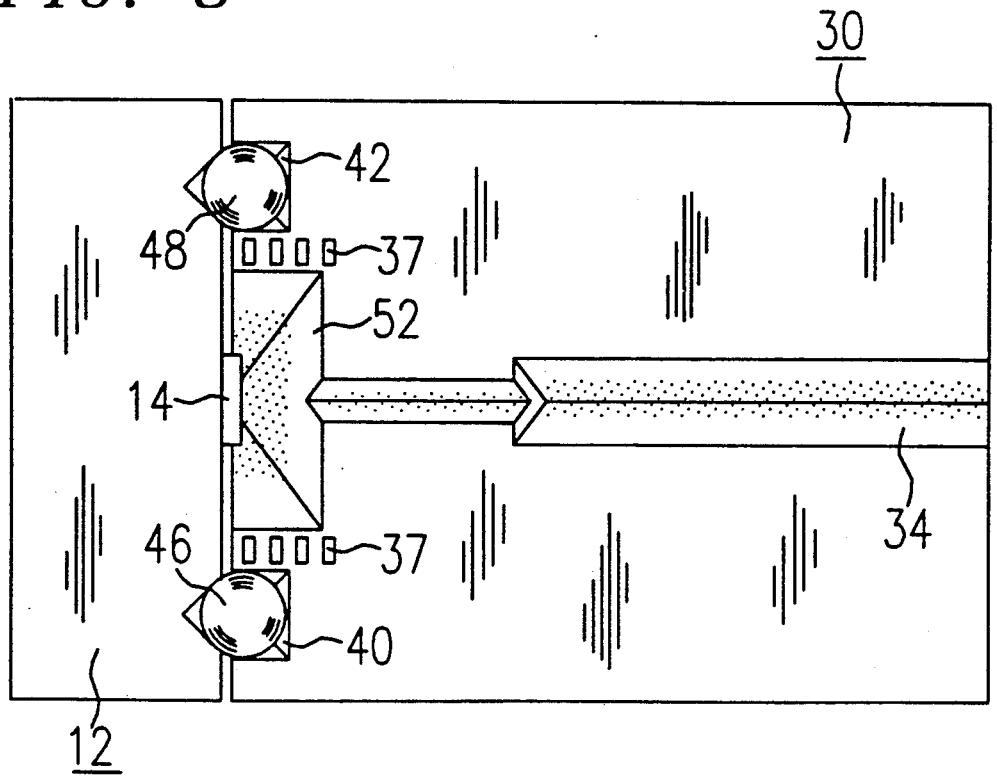
FIG. 8 includes a top view of an optical assembly formed in accordance with the present invention.

FIG. 8 contains a cut-away top view of an exemplary optical assembly formed in accordance with the present invention, illustrating in particular the configuration of fiducials 40 and 42 (as well as opening 52) in second member 30. The mating of first member 12 to second member 30 is also shown. The size of opening 52 is formed sufficiently large to allow for the coupling of optical device 14 to fiber 32, as well as the placement (optional) of coupling lens 50.

Figure 9:
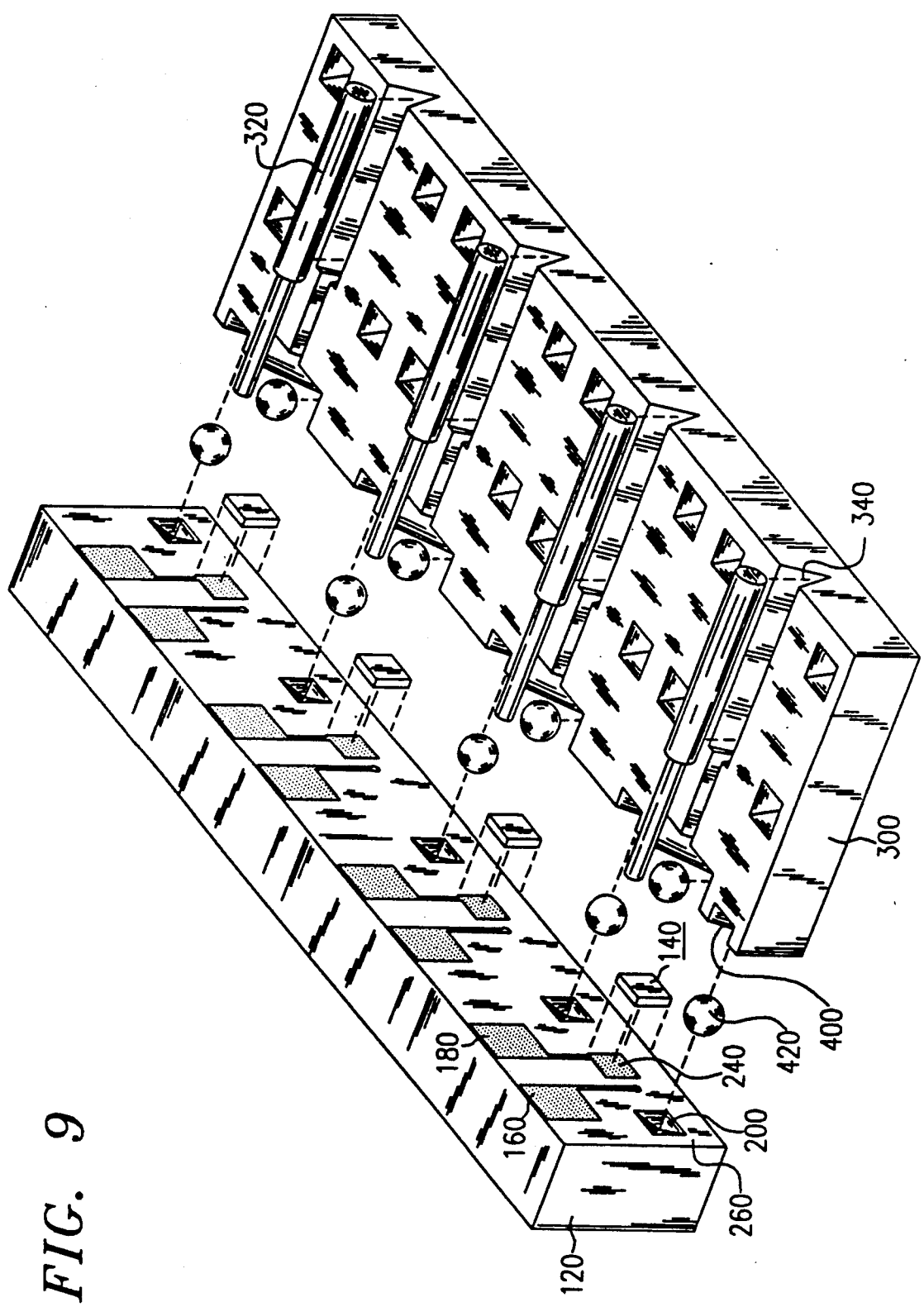
FIG. 9 illustrates an alternative optical array assembly formed in accordance with the teachings of the present invention.

FIG. 9 illustrates an alternative array embodiment of the present invention. As shown, a first member 120 is formed to include a plurality of active optical devices 140 disposed as shown in surface 260 of member 120. Associated electrical bond pads 160, 180 are also illustrated. Fiducials 200 may be formed as shown in FIG. 9. It is to be understood that a smaller number of such fiducials may be required with an array embodiment, since separate fiducials are not required for each optical device location. In particular, the arrangement as illustrated in FIG. 9 includes only a single fiducial between adjacent devices. A second member 300 may be formed as shown in FIG. 9 to include a plurality of grooves 340 for supporting an associated plurality of optical fibers 320. Fiducials 400 are formed as shown in member 300 to provide alignment with fiducials 200 of first member 120. Mechanical attachment between first member 120 and second member 300 is achieved by including a plurality of spheres 420 between the aligned plurality of fiducials 200 and 400, as shown. In an exemplary arrangement of the embodiment of FIG. 9, the array may comprise a pair of device-fiber couplings, forming either a transmitter-receiver pair or a sparing arrangement.

Finally, it will be appreciated that although today's technology suggests that silicon is the preferred material from which the principal piece parts of the invention are made, it is possible that different circumstances (e.g., system specifications and cost considerations) might render it desirable to utilize a different semiconductor material (e.g., Ge, GaAs), or a plastic which may be molded (e.g., injection molded) to form the requisite alignment fiducials.

We claim:
1. An optical assembly comprising
   a first member including top and bottom major surfaces for the mounting of at least one active optical device on said top major surface thereof, said first member comprising a first set of fiducial features formed on said top major surface and including electrically conductive bonding means for the attachment of said active optical device, said electrically conductive bonding means disposed on said top major surface at a predetermined location with respect to said first set of fiducial features; and
   a second member including top and bottom major surfaces for the support of at least one optical fiber, said second member including at least one longitudinal groove formed along said top major surface thereof for the placement of said at least one optical fiber, the second member further comprising a second set of fiducial features exposed in a surface orthogonal to said top major surface, said second set of fiducial features located so as to align with the location of the first set of fiducial features of said first member and provide fixed attachment of said first member to said second member.

2. An optical assembly as defined in claim 1 wherein the first member is capable of mounting a plurality of active optical devices and the second member is capable of supporting an associated plurality of optical fibers.

3. An optical assembly as defined in claim 1 wherein the first and second members comprise a semiconductor material.

4. An optical assembly as defined in claim 3 wherein the first and second members comprise silicon.

5. An optical assembly as defined in claim 1 wherein the first and second members comprise a plastic material .

6. An optical assembly as defined in claim 1 wherein the electrically conductive bonding means comprises a solder preform.

7. An optical assembly as defined in claim 6 wherein the solder preform is capable of being liquified when heated such that an optical device placed on the surface thereof will align to said preform upon heating.

8. An optical assembly as defined in claim 6 wherein the solder preform comprises a tin-gold combination.

9. An optical assembly as defined in claim 1 wherein the first and second fiducial features comprise a set of openings formed in the associated surfaces of the first and second members, respectively, the fiducial features further comprising a plurality of spherical members disposed between associated openings so as to provide mechanical mating of the first and second members.

10. An optical assembly as defined in claim 9 wherein the first and second members comprise silicon, wherein the fiducial openings comprise features etched into the silicon surface.

11. An optical assembly as defined in claim 1 wherein the first and second fiducial features comprise a set of grooves and ridges, a set of grooves formed on either one of the first and second member and the ridges formed on the remaining member, the grooves and ridges disposed to provide alignment between the first and second members upon mating.

12. An optical assembly as defined in claim 1 wherein the assembly further comprises
a third member disposed to cover the major surface of the second member supporting the optical fiber, the second and third members formed to include a plurality of fiducial features to facilitate the alignment and attachment therebetween.

13. An optical assembly as defined in claim 12 wherein the plurality of fiducial features comprises a first plurality of openings formed in the top major surface of the second member and an associated plurality of openings formed in the attaching surface of the third member, with a plurality of spherical members disposed therebetween.

14. An optical assembly as defined in claim 1 wherein the at least one active optical device comprises an LED.

15. An optical assembly as defined in claim 1 wherein the at least one active optical device comprises a photodiode.

16. An optical assembly as defined in claim 1 wherein the first member further includes a pair of electrical lead pads attached to the surface of the member to provide an electrical signal path to the active optical device.

17. An optical assembly as defined in claim 16 wherein the first member further includes electronic circuitry, disposed along the top surface thereof, associated with the operation of the active optical device.

18. A method of forming an optical assembly comprising the steps of:
a) providing first and second separate support members, each including a top major surface and sidewalls orthogonal thereto;
b) forming fiducial alignment features on the top major surface of said first support member and on a sidewall of said second support member;
c) forming electrically conductive bonding means on said top major surface of said first member at a predetermined location with respect to said associated fiducial alignment features;
d) forming a longitudinal groove along the top major surface of said second support member for the placement of an optical fiber, the longitudinal groove disposed to provide alignment between an active optical device and an optical fiber; and
e) fixing said first support member to said second support member by aligning and attaching the fiducial alignment features of said first member to the fiducial alignment features of said second member.

19. The method according to claim 18 wherein in performing step a), semiconductor substrate support members are provided.

20. The method according to claim 19 wherein the provided support members comprise silicon.

21. The method according to claim 20 wherein in performing steps b) and d), etching is used to form fiducial alignment features and the longitudinal groove.

22. The method according to claim 21 wherein in performing step e), spheres are inserted between and attached to the etched fiducial alignment features to achieve attachment of the first support member to the second support member.

23. The method according to claim 18 wherein in performing step a), plastic substrate support members are provided.

24. The method according to claim 18 wherein the method comprises the further steps of:
f) placing an active optical device on the conductive bonding means of step c); and
g) heating the conductive bonding means to liquify and allow said active optical device to align with the underlying conductive bonding means.

* * * * *